United States Patent [19]
Gutmann et al.

[11] Patent Number: 5,605,223
[45] Date of Patent: Feb. 25, 1997

[54] CONDUCTIVE LACQUER CONTACT SURFACE

[75] Inventors: Klaus Gutmann, Paderborn; Hans-Werner Lückehe, Salzkotten-Holsen, both of Germany

[73] Assignee: Siemens Nixdorf Informationssysteme AG, Paderborn, Germany

[21] Appl. No.: 500,961

[22] PCT Filed: Nov. 15, 1993

[86] PCT No.: PCT/DE93/01197

§ 371 Date: Aug. 2, 1995

§ 102(e) Date: Aug. 2, 1995

[87] PCT Pub. No.: WO94/17541

PCT Pub. Date: Aug. 4, 1994

[30] Foreign Application Priority Data

Jan. 25, 1993 [DE] Germany .................. 43 01 928.5

[51] Int. Cl.⁶ .................................................. H01H 1/06
[52] U.S. Cl. .......................... 200/275; 200/243; 200/239
[58] Field of Search ................... 200/275, 5 A, 200/512, 239, 243, 278, 292, 513, 514, 515, 516, 517, 518, 519

[56] References Cited

U.S. PATENT DOCUMENTS

| | | |
|---|---|---|
| 4,029,916 | 6/1977 | Chu . |
| 4,085,306 | 4/1978 | Dunlap . |
| 4,652,704 | 3/1987 | Franklin . |
| 4,818,828 | 4/1989 | Curley et al. . |
| 4,987,275 | 1/1991 | Miller et al. ............................. 200/275 |
| 5,471,021 | 11/1995 | Malesko ................................. 200/275 |

FOREIGN PATENT DOCUMENTS

| | | |
|---|---|---|
| 0481335A2 | 4/1992 | European Pat. Off. . |
| 146873 | 3/1981 | Germany . |
| 3603680 | 8/1987 | Germany . |
| 3615742 | 11/1987 | Germany . |
| 3714382 | 11/1987 | Germany . |

OTHER PUBLICATIONS

"Gummischaltmatten CRS Produkt Informationen", ITT Shadow, pp. 5, 6, 7, 10 and 11. No date.

"Konstruktions–hinweise, Kontaktmatten, Schaltelemente aus Silikonelastomer für die Elektronik" Carl Freudenberg, pp. 12 and 13. No date.

*Primary Examiner*—David J. Walczak
*Attorney, Agent, or Firm*—Hill, Steadman & Simpson

[57] ABSTRACT

In order to produce keyboards, two pairs of diagonally connected squares with rounded corners are used as fixed contacts. A direct diagonal connection electrically connects two non-adjacent squares. The squares are conductive lacquer (carbon lacquer) and cover copper pads on a printed circuit board.

4 Claims, 2 Drawing Sheets

CONDUCTIVE LACQUER CONTACT SURFACE

BACKGROUND OF THE INVENTION

The invention relates to an arrangement of contact surfaces for switches, pushbutton switches and keyboards.

Switches, pushbutton switches or keypads, in particular entry keyboards for data processing systems, are often constructed on carrier boards. In this case, it has proved to be advantageous to use a printed circuit board as the carrier board and to implement fixed key contacts as specially formed conductor tracks, so-called contact surfaces. When a key is pressed down, a contact bridge, which is often made of conductive rubber, is pressed against the contact surfaces by the movable part of the key.

An arrangement of two adjacent semicircles as in German reference DE A 37 14 382 is already used for the contact surfaces. In this case, the contact surfaces composed of copper are coated on the surface, because otherwise any possible corrosion would prevent reliable contact-making. A gold layer which is applied by electroplating is used as the surface coating. In order to avoid the high production costs of gold plating, use is also made of a conductive lacquer which is applied, for example, by screen printing. However, the contact-making of this arrangement is not reliable enough for keyboards which have stringent requirements placed on the contact reliability. Therefore, use is also made of a form as in U.S. Pat. No. 4,818,828, in the case of which the contact surfaces engage into one another in the form of fingers. However, in this form it is possible to carry out the surface coating by means of conductive lacquers using screen printing only when there are few fingers or large key spacings, since the meandering interspace between the fingers would have to be so narrow that the tolerances of the printing method for the conductive lacquer would not permit reliable production.

SUMMARY OF THE INVENTION

The object of the invention is to implement contact surfaces in such a manner that conductive lacquers can be used as the surface coating and better contact-making is achieved in comparison with the form of semicircles.

The preferred embodiment of the invention uses a contact zone of four contact surfaces at the corners of an imaginary square, in each case two diagonally opposite surfaces being electrically connected to one another. In this way, respectively adjacent contact surfaces are connected to different poles of the switch. Therefore, contact is always made when the contact bridge touches two adjacent contact surfaces. Therefore, as illustrated in FIG. 4, a connection is already established even in the event of incomplete key actuation, when only that part of the contact bridge which is drawn in bold is effective, whereas this is not the case, under the same conditions, in the case of the known semicircle arrangement according to FIG. 3. As a result, the contact-making reliability is considerably improved because the number of possible contact-making surfaces is doubled. In the case of the diagonal form according to the invention, the contact surfaces can be dimensioned in such a way that they can be produced, as in the case of the known semicircle arrangement, from an electrically conductive lacquer, preferably a carbon lacquer, because the spacings are large enough to tolerate inaccuracies of a simple printing method. They are applied over, and so as to overlap, copper pads, from which the connection is carried out by means of a suitable printed circuit board track configuration.

An advantageous development is to connect diagonally to one another a pair of contact surfaces within the contact zone. This connection contributes to the contact-making; in addition, only one electrical connection routed around the contact zone is now necessary.

The contact surfaces preferably have a square configuration, but they can also be implemented as segments of a circle. Likewise, more than four, therefore six, for example, contact surfaces are possible.

Since the contact surfaces can be applied using devices which are present in any case for every printed circuit board production process, for example for population printing, high quality keyboards can now be produced in a shorter time and with a lower outlay.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
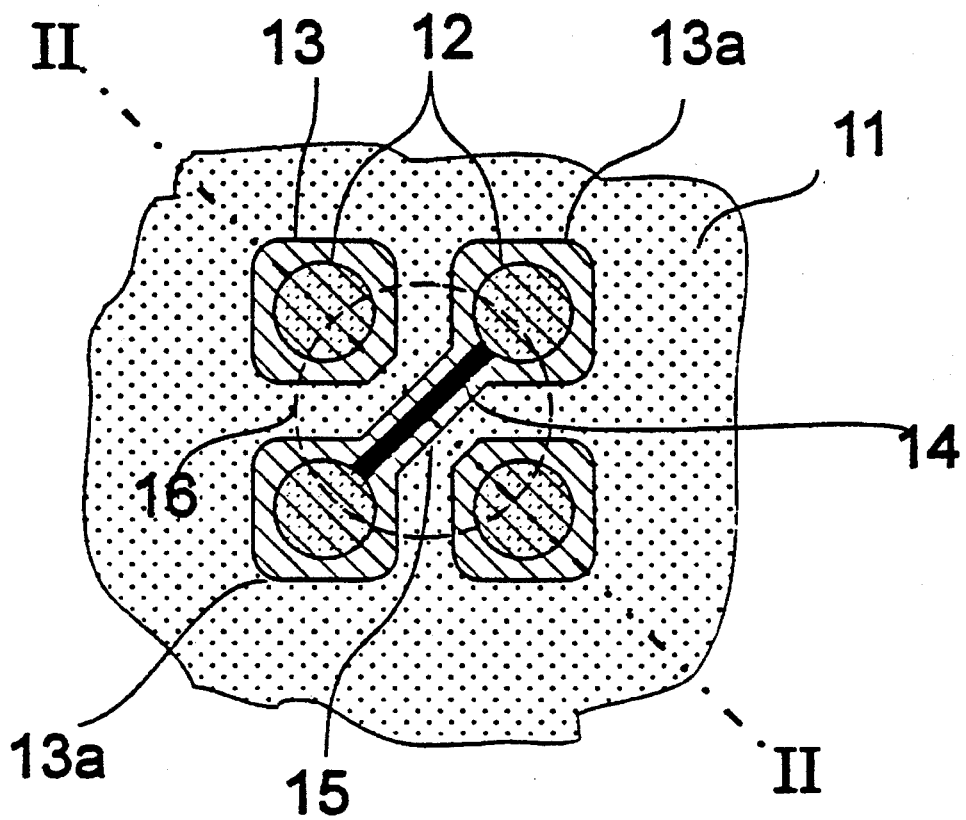
FIG. 1 shows a plan view of the arrangement of the contact surfaces in a contact zone on a printed circuit board.
Figure 2:
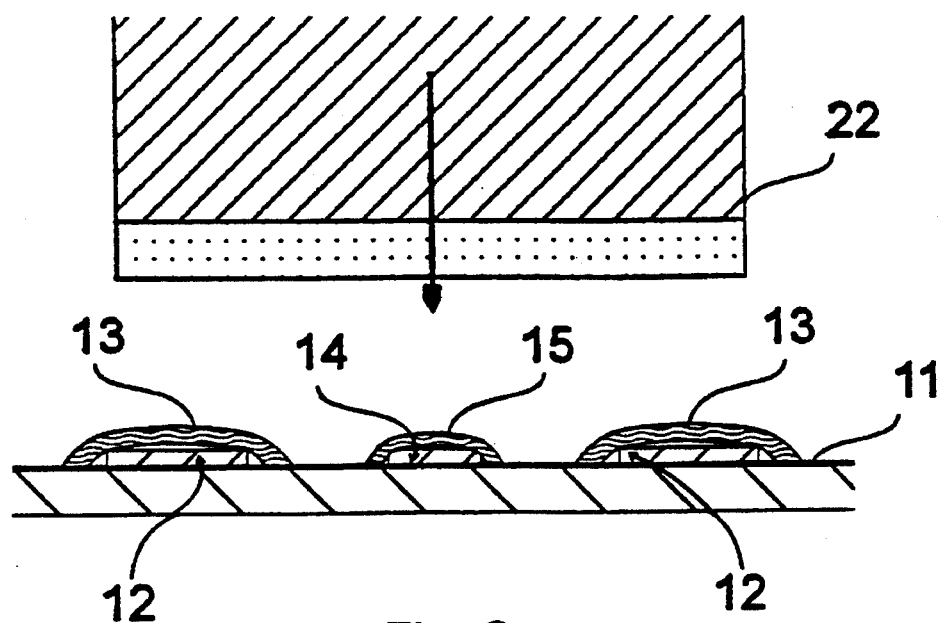
FIG. 2 shows a section through the arrangement according to FIG. 1 along the line II—II, a contact punch with a contact bridge being additionally illustrated.

In accordance with FIG. 1, the contact zone of a key is constructed on an insulating carrier board 11, preferably a printed circuit board. Copper surfaces 12 are initially applied to the latter in accordance with a method which is known from printed circuit board production. These copper surfaces 12 are circular and have a diameter which is equal to approximately half the diameter of a circular contact bridge 22 which is arranged above them. The bridge 22 can be lowered in a known manner by key actuation. The bridge 22 is also illustrated in the section II—II in FIG. 2 and the maximum possible effective area 16 of which is illustrated as a circle. The center points of the copper surfaces are situated slightly outside the circle which can be described by the contact bridge. As shown in FIG. 2, each of the contact surfaces has a convex configuration with beveled corners. The copper surfaces are electrically connected to an evaluation circuit by means of supply lines (not illustrated). Contact surfaces 13 are applied to the copper surfaces 12, for example by means of screen printing using conductive lacquers, preferably carbon lacquer. These contact surfaces 13 overlap the copper surfaces 12 on all sides and thus adhere additionally to the carrier board 11. The supply lines are protected in a conventional manner by a solder resist which covers the printed circuit board outside the contact surfaces and is likewise not illustrated in the figures.

Figure 3:
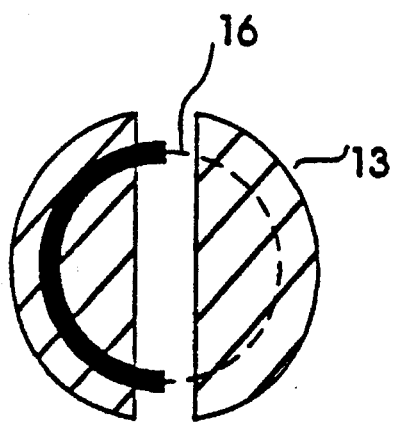
FIG. 3 shows contact surfaces of the known arrangement in the form of semicircles with the effective region of the contact bridge and the marked region for partial contact-making.
Figure 4:
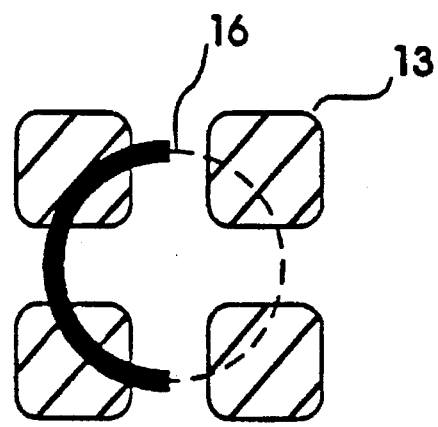
FIG. 4 shows contact surfaces in a diagonal arrangement.

In order to illustrate the difference between the arrangement according to the invention and the prior art, the known design with semicircular surfaces is illustrated in FIG. 3, the maximum possible effective area 16 of the contact bridge 22 being indicated as a circle. As an example of incomplete actuation, the contact bridge may be effective only partially and at the edge, as is illustrated by the part drawn in bold in FIGS. 3 to 6. This is a frequent occurrence in entry keyboards when the key heads are pressed only at the edge. Whereas there is no connection of the contact surfaces in this case of the arrangement according to FIG. 3, a connection is achieved in FIG. 4 in the case of the diagonal arrangement which is illustrated in a simplified manner and has square contact surfaces.

Figure 5:
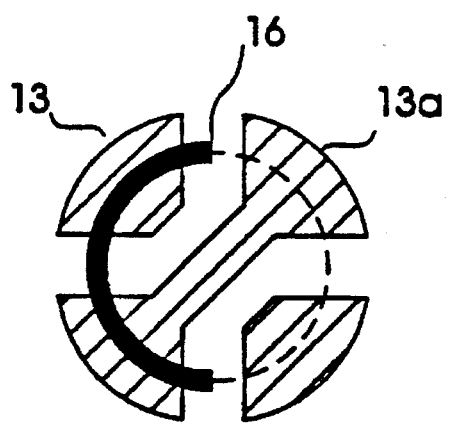
FIG. 5 shows four segments of a circle as the contact surfaces.
Figure 6:
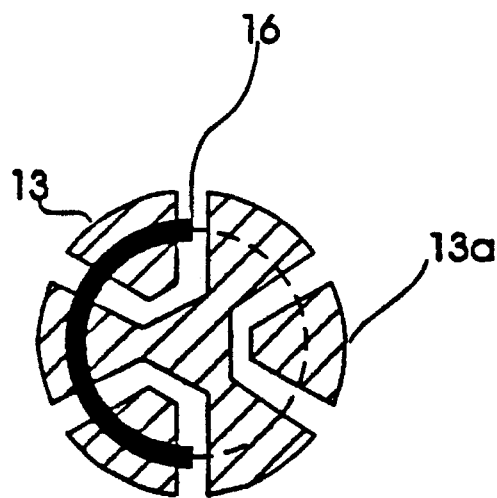
FIG. 6 shows six segments of a circle as the contact surfaces.

The same applies to the alternative embodiments with segments of a circle according to FIG. 5 and with six contact surfaces in the form of segments according to FIG. 6.

As illustrated in FIGS. 1, 5 and 6, in a development of the invention, every second contact surface is connected to one another via the center of the contact zone on the surface of the contact zone, and the connection is configured like a contact surface. In FIG. 1, the connection is constituted by a copper track 14, which is covered by a conductive lacquer track 15 in the same way that the copper surfaces 12 are covered by the contact surfaces 13. The copper tracks are not illustrated in the arrangements according to FIGS. 5 and 6; they are implemented in the same way as in FIG. 1.

After thorough testing, the following dimensions have proved to be particularly favorable for the contact zone of a keyboard corresponding to the standard for typewriters: the contact bridge 22 is circular with a diameter of 3.5 mm. The copper surfaces 12 are circular with a diameter of 1.575 mm and their center points are situated on a square with an edge length of 2.7 mm. The contact surfaces 13 are square with an edge length of 2.044 mm and have rounded corners. Two diagonally opposite copper surfaces are connected by a copper web having a width of 0.3 mm. The contact surfaces are correspondingly connected by a web of carbon lacquer having a width of 0.6 mm. The two other contact surfaces are not rounded on the side facing this web, but rather are beveled with the result that their spacing from the web is 0.512 mm. The spacing between the contact surfaces is 0.685 mm along one side. Hence, the edges of the contact surfaces have a spacing of at least 0.5 mm and the surfaces themselves are at least 0.5 mm wide, with the result that known devices which are present for the solder resist mask and the population printing can be used for the application of the conductive lacquer. The bare part of the solder resist has an edge length of 4.496 mm and rounded corners.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A contact zone for electrical pushbutton switches, the contact zone having a plurality of contact surfaces that are connectable by a conductive contact bridge, comprising:

contact surfaces of said plurality of contact surfaces being arranged symmetrically about a center point of the contact zone;

the contact surfaces being structured as at least two pair of convex surface elements;

at least one diagonally opposite first pair of contact surface elements being spaced apart such that a substantial part of a center area of the contact zone is left open, and at least one diagonally opposite second pair of contact surface elements being electrically connected to one another; and the contact surfaces of the plurality of contact surfaces being substantially square and clear spacings between edges of adjacent contact surface elements being between half and a fifth of a lateral length of the contact surfaces.

2. The contact zone as claimed in claim 1, wherein the contact zone further comprises a center area and wherein said at least one diagonally opposite second pair of the pairs of contact surface elements are connected together by a web through the center area of the contact zone in a plane of the contact surfaces, which web is an additional contact surface, and wherein corners, directed toward the web, of the first pair of contact surface elements are beveled.

3. The contact zone as claimed in claim 1, wherein an edge length of the contact surface elements is 2 mm, clear spacing between adjacent contact surface elements is 0.7 mm, distance between the center points of adjacent contact surface elements is 2.7 mm, wherein a web through a center area of the contact zone electrically connects said at least one diagonally opposite second pair of contact surface elements, said web having a web width of 0.6 mm.

4. The contact zone as claimed in claim 1, wherein the contact surfaces are electrically conductive lacquer and are applied over preferably circular copper surfaces and overlap the circular copper surfaces on all sides.

* * * * *